United States Patent
Nowak

[19]

[11] Patent Number: 6,064,263
[45] Date of Patent: May 16, 2000

[54] DTCMOS DIFFERENTIAL AMPLIFIER

[75] Inventor: Edward J. Nowak, Essex Junction, Vt.

[73] Assignee: International Business Machines Corporation, Armonk, N.Y.

[21] Appl. No.: 09/293,116

[22] Filed: Apr. 16, 1999

[51] Int. Cl.[7] .............................. H03F 3/45; H03F 3/14; H03K 5/22
[52] U.S. Cl. ........................ 330/253; 330/307; 327/65; 327/77
[58] Field of Search ..................... 330/253, 277, 330/307; 327/63, 65, 77, 81; 257/67

[56] References Cited

U.S. PATENT DOCUMENTS

| | | | |
|---|---|---|---|
| 4,888,631 | 12/1989 | Azuma et al. | 357/23.6 |
| 5,003,271 | 3/1991 | Swanson | 330/298 |
| 5,010,304 | 4/1991 | Mueller et al. | 330/277 |
| 5,113,092 | 5/1992 | Herold | 307/356 |
| 5,463,347 | 10/1995 | Jones et al. | 330/253 |
| 5,559,892 | 9/1996 | Boor | 330/277 |
| 5,764,101 | 6/1998 | Archer | 330/253 |
| 5,789,980 | 8/1998 | Nagata et al. | 330/253 |
| 5,808,513 | 9/1998 | Archer | 330/253 |

OTHER PUBLICATIONS

P. Allen et al; CMOS OPAMP Using Bulk–Driven MOSFETS; ISSCC95/Session 11/Technology Directions: RF and analog/Paper TP 11.4 pp. 192–193.

T. Hirota et al; 0.5V 320MHZ 8B Multiplexer/Demultiplexer Chips Based on a Gate Array With Regular Structured DTMOS/SOI; IEEE 1998; FP12.2–1 12.2–2.

Y. Wada et al; Active Body–Bias SOI–CMOS Driver Circuits; 1997 Symposium on VLSI Circuits Digest of Technical Papers 4–3; pp. 29–30.

Y. Oowaki et al; A SUB–0.1UM Circuit Design with Substrate–Over–Biasing; IEEE, 1998; ISSCC; TP6.2–1 6.2–2.

T. Fuse et al; 0.5V SOI CMOS Pass–Gate Logic; Digest of Technical Papers—IEEE International Solid–State Circuits Conference; vol. 39, Feb. 1996; pp. 88–89.

*Primary Examiner*—Robert Pascal
*Assistant Examiner*—Patricia T. Nguyen
*Attorney, Agent, or Firm*—Whitham, Curtis & Whitman; Eugene I. Shkurko, Esq.

[57] ABSTRACT

An amplifier is constructed having a FET formed in a substrate with its gate coupled to a first voltage terminal. A second FET formed in the substrate is coupled both to the first FET and to a second voltage terminal. The second FET has its gate directly coupled to its body. The second FET electrically isolated from the substrate. An input node at the coupled gate-body receives an input signal. An output node between the first and second FETs outputs a signal in response to the input signal.

6 Claims, 1 Drawing Sheet

DTCMOS DIFFERENTIAL AMPLIFIER

BACKGROUND OF THE INVENTION

1. Field of the Invention

The present invention generally relates to designing a differential amplifier capable of working with a reduced voltage power supply.

2. Background Description

Historically, differential amplifiers require three stacked transistors for operation: a current source to set the quiescent DC bias, the input differential pair, and the load transistors. Complementary Metal Oxide Semiconductor (CMOS) transistors require a reasonable threshold voltage (typically 0.5 v) for proper operation. Since the sum of the threshold voltages of the three stacked devices exceeds one volt, this type of differential amplifier is not feasible for very low power supply voltages (<1 V).

If the device thresholds were reduced to 0.2 v, a normal amplifier could work, but the dynamic range would be reduced to 0.4 v, and DC standby power would increase, which for many mobile battery applications would be unacceptable.

SUMMARY OF THE INVENTION

The present invention to improves the dynamic range and fidelity of a differential amplifier. In particular, the amplifier according to the invention has a larger dynamic range, higher gain and lower distortion than a grounded body amplifier.

The Dynamic Threshold CMOS (DTCMOS) differential amplifier of the present invention comprises a first Field Effect Transistor (FET) formed in the semiconductor substrate having its gate coupled to a first voltage terminal. A second FET is formed in the substrate and coupled both to the first FET and to a second voltage terminal. The second FET has a gate directly connected to its body, and the second FET is electrically isolated from the substrate. An input node at the coupled gate-body receives an input signal, and an output node between the first and second FETs output a signal in response to the input signal.

The operation of the DTCMOS amplifier according to the invention is similar to traditional designs except DC bias at the source does not determine the body-source potential; rather, the body-source potential is a function of the input signal. The net effect is to reduce body-source potential which in turn lowers the threshold voltage of the device. In addition, distortion is reduced and gain is increased.

BRIEF DESCRIPTION OF THE DRAWINGS

The foregoing and other objects, aspects and advantages will be better understood from the following detailed description of a preferred embodiment of the invention with reference to the drawings, in which the sole figure is circuit diagram showing the DTCMOS differential amplifier according to the invention.

DETAILED DESCRIPTION OF A PREFERRED EMBODIMENT OF THE INVENTION

Figure 1:
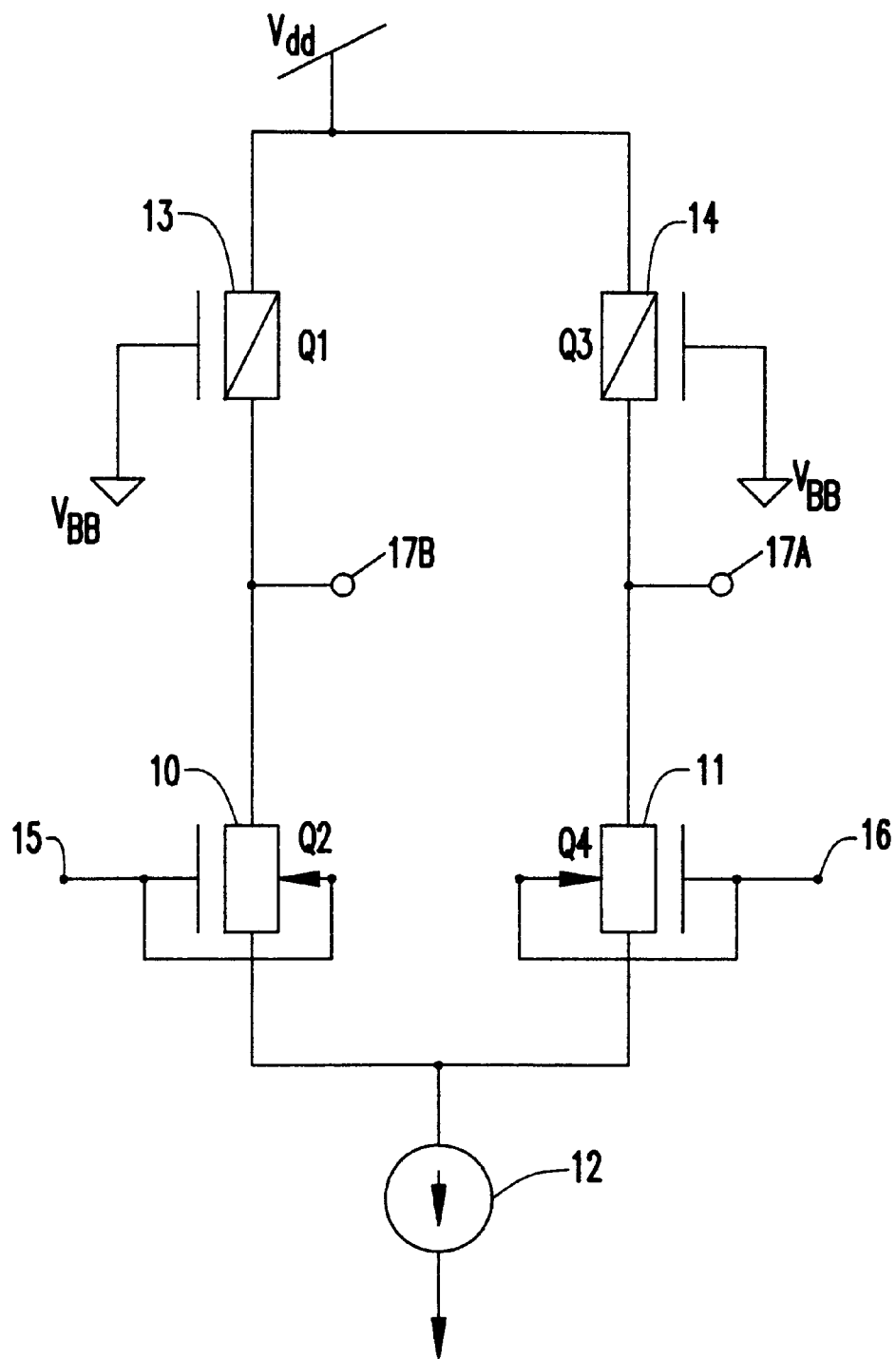

Referring now to the drawing, there is shown a schematic representation of the DTCMOS (Dynamic Threshold CMOS) differential amplifier according to the invention. DTCMOS is usually associated with SOI (Silicon On Insulator) technology since the body is intrinsically isolated in this technology allowing for individual connection of the body to gate.

As shown in the Figure, the circuit comprises a differential pair of Field Effect Transistors (FETs) 10 and 11 coupled through a constant current source 12 to ground and through a pair of load FETs 13 and 14 to source voltage Vdd. In the example illustrated, the FETs 10 and 11 are n-type FETs, and the FETs 13 and 14 are p-type FETs. Input nodes 15 and 16 are respectively connected to the gates of FETs 10 and 11, and output nodes 17a and 17b are taken from the junction of FETs 11 and 14, and FETs 13 and 10, respectively. The load FETs 13 and 14 are formed in the semiconductor substrate and have their gates connected to a D.C. bias $V_{BB}$ (which may be ground). The differential pair FETs 10 and 11, however, while formed in the semiconductor substrate are electrically isolated from the substrate. The isolated body devices can be fabricated with Silicon On Insulator (SOI) technology or using triple well processes. In addition, the gates of FETs 10 and 11 are directly coupled to the body of the corresponding FET.

The operation of this amplifier is similar to traditional designs except DC bias does not determine the body-to-source potential of the input FETs amplifier as with the traditional grounded body amplifier design. This is evident from the circuit since the body is directly connected to the gate, as shown by FETs 10 and 11. Hence, the body-source potential is a function of the input signal. Assuming a positive input signal, the net effect of operating the device in this configuration is to reduce body-source potential, which in turn lowers the threshold voltage of the device. Furthermore, distortion is reduced because the vertical electric field in the silicon remains more nearly constant, as opposed to traditional designs where increasing the gate drive greatly increases the vertical field causing the lateral mobility of carriers to degrade. The average vertical electrical field in the MOSFET inversion layer can be calculated (Taur & Ning, *Fundementals of Modern VLSI Devices*, p. 133, Cambridge Univ. Press, 1998) from $E = (V_{GATE} + V_T + \phi)/(6T_{OX})$, where E is the average vertical electric field in the inversion layer, $V_T$ is the threshold voltage of the MOSFET, $\phi$ (~0.4 V typically) is related to the work-functions of the semiconductors used to construct the device, and $T_{OX}$ is the gate insulator thickness. Since $V_T$ decreases as the body voltage of an n-MOSFET is made positive with respect to its source, one can see that E increases more slowly with (increasing) $V_{GATE}$ when the body is electrically connected to the gate, as in FETs 10 and 11 (Q2 and Q4).

A DTCMOS differential amplifier provides the following advantages over the grounded body amplifier: 1) larger dynamic range; 2) higher grain; and 3) lower distortion.

Some amplifier designs may use a body-source configuration, that is, a fixed body-to-source voltage is provided for the input FETs. Although the DTCMOS amplifier's dynamic range advantage is reduced in this case, it still has a larger range since the threshold will decrease with the input signal. DTCMOS still retains higher grain and lower distortion above over body-source configuration.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A circuit comprising:

a substrate;

a first FET formed in the substrate having its gate coupled to a first voltage terminal;

a second FET formed in the substrate and coupled both to the first FET and to a second voltage terminal, the second FET having its gate directly coupled to its body, and the second FET electrically isolated from the substrate;

an input node at the coupled gate-body for receiving an input signal; and an output node between the first and second FETs for outputting a signal in response to the input signal.

2. A circuit comprising:

a substrate;

a pair of legs coupled in parallel to a voltage terminal and current source, each of the legs comprising:

a load FET formed in the substrate having its gate coupled to the voltage terminal;

a differential FET formed in the substrate and coupled both to the load FET and to the current source, and differential FET having its gate directly coupled to its body, and the differential FET electrically isolated from the substrate;

an input node a the coupled gate-body for receiving a differential input signal in conjunction with the input node of the other leg; and an output node between the load and differential FET for outputting a differential output signal in conjunction with the output node of the other leg in response to the differential input signal.

3. A Dynamic Threshold Complementary Metal Oxide Semiconductor (DTCMOS) differential amplifier circuit formed in a semiconductor substrate comprising:

a first differential pair of Field Effect Transistors (FETs) of a first conductivity type connected to a current source, gates of the first differential pair of FETs being connected to first and second input terminals and coupled directly to respective bodies of the FETs, the first differential pair of FETs being electrically isolated from the substrate; and a second pair of load FETs of a second conductivity type each respectively connected to a corresponding one of said first differential pair of FETs, at least one output terminal connected to a junction of one of the FETs of the first differential pair of FETs and the corresponding one of the FETs of the second pair of load FETs.

4. The DTCMOS differential amplifier circuit recited in claim 3 wherein the second pair of load FETs are connected to a first voltage terminal, the current source is connected to a second voltage terminal, and gates of the second pair of load FETs are connected to a third voltage terminal.

5. The DTCMOS differential amplifier circuit recited in claim 4 wherein the first differential pair of FETs are n-type FETs, the second pair of load FETs are p-type FETs, the first voltage terminal is a source voltage, the second voltage terminal is ground, and the third voltage terminal is a bias voltage.

6. The DTCMOS differential amplifier circuit recited in claim 5 wherein the third voltage terminal is ground.

* * * * *